(12) United States Patent
Lee et al.

(10) Patent No.: US 10,937,935 B2
(45) Date of Patent: Mar. 2, 2021

(54) FLIP CHIP TYPE LIGHT EMITTING DIODE CHIP AND LIGHT EMITTING DEVICE INCLUDING THE SAME

(71) Applicant: SEOUL VIOSYS CO., LTD., Gyeonggi-do (KR)

(72) Inventors: Jin Woong Lee, Gyeonggi-do (KR); Kyoung Wan Kim, Gyeonggi-do (KR); Keum Ju Lee, Gyeonggi-do (KR)

(73) Assignee: SEOUL VIOSYS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/453,332

(22) Filed: Jun. 26, 2019

(65) Prior Publication Data
US 2020/0006612 A1 Jan. 2, 2020

(30) Foreign Application Priority Data
Jun. 27, 2018 (KR) .................. 10-2018-0073724

(51) Int. Cl.
*H01L 33/62* (2010.01)
*H01L 33/24* (2010.01)
(Continued)

(52) U.S. Cl.
CPC .............. *H01L 33/62* (2013.01); *H01L 33/24* (2013.01); *H01L 33/42* (2013.01); *H01L 33/46* (2013.01); *F21K 9/232* (2016.08); *F21Y 2115/10* (2016.08)

(58) Field of Classification Search
CPC ......... H01L 33/62; H01L 33/24; H01L 33/46; H01L 33/42; H01L 33/20; H01L 33/38;
(Continued)

(56) References Cited

U.S. PATENT DOCUMENTS

| 2014/0361327 A1* | 12/2014 | Chae .................. H01L 33/46 257/98 |
| 2016/0329461 A1 | 11/2016 | Huang et al. |
| 2020/0251632 A1* | 8/2020 | Wu .................. H01L 33/60 |

FOREIGN PATENT DOCUMENTS

| TW | 523833 | 3/2003 |
| TW | 200605394 | 2/2006 |

(Continued)

OTHER PUBLICATIONS

Search Report appended to an Office Action, which was issued to Taiwanese counterpart application No. 108121165 by the TIPO dated Mar. 20, 2020.

*Primary Examiner* — Allen L Parker
*Assistant Examiner* — Wasiul Haider
(74) *Attorney, Agent, or Firm* — Burris Law, PLLC

(57) ABSTRACT

A light emitting diode chip includes: a first conductivity type semiconductor layer; a mesa disposed on a partial region of the first conductivity type semiconductor layer, and including an active layer and a second conductivity type semiconductor layer; a transparent electrode being in ohmic contact with the second conductivity type semiconductor layer; a first current spreader being in ohmic contact with the first conductivity type semiconductor layer; a second current spreader electrically connected to the transparent electrode; an insulation layer covering the mesa, the first current spreader and the second current spreader, and including a distributed Bragg reflector. A lateral distance between the first current spreader and the mesa is larger than a thickness of the insulation layer, and a first side surface of the first current spreader close to the mesa is longer than the second side surface thereof.

20 Claims, 8 Drawing Sheets

(51) Int. Cl.
*H01L 33/46* (2010.01)
*H01L 33/42* (2010.01)
*F21Y 115/10* (2016.01)
*F21K 9/232* (2016.01)

(58) Field of Classification Search
CPC ......... H01L 33/10; H01L 33/14; H01L 33/36; H01L 33/385
See application file for complete search history.

(56) References Cited

FOREIGN PATENT DOCUMENTS

| | | |
|---|---|---|
| TW | 201409708 | 3/2014 |
| TW | 201715759 | 5/2017 |

\* cited by examiner

FLIP CHIP TYPE LIGHT EMITTING DIODE CHIP AND LIGHT EMITTING DEVICE INCLUDING THE SAME

CROSS-REFERENCE TO RELATED APPLICATIONS

This application claims priority to and the benefit of Korean Patent Application No. 10-2018-0073724, filed on Jun. 27, 2018, which is hereby incorporated in its entirety by reference for all purposes as set forth herein.

TECHNICAL FIELD

Exemplary embodiments of the present disclosure relate to a flip chip type light emitting diode chip, and a light emitting device including the same.

BACKGROUND

Light emitting diodes are used in various products such as large back light units (BLUs), general lighting, electric products, small home appliances, and interior products. Light emitting diodes can be used not only as a light source, but also for various purposes including conveying of information, aesthetic applications, and the like.

Meanwhile, a flip chip type light emitting diode is generally fabricated to provide a high efficiency light emitting diode. The flip chip type light emitting diode has excellent heat dissipation performance and may improve the light extraction efficiency by using a reflective layer. Further, since the flip bonding technique is used, a bonding wire can be omitted, and the stability of the light emitting device improves.

Conventionally, the flip chip type light emitting diode generally uses a metal reflective layer to reflect light. Since the metal reflective layer has both an ohmic characteristic and a reflection characteristic at the same time, both light reflection and electrical connection may be achieved. However, the reflectivity of the metal reflective layer is not relatively high, thereby resulting in significant loss of light. Moreover, in case the light emitting diode may be used for an extended period of time, the reflectivity of the metal reflective layer may decrease.

Therefore, there is a need for a flip chip type light emitting diode capable of reducing light loss due to the use of the metal reflective layer.

SUMMARY

Exemplary embodiments of the present disclosure provide a flip chip type light emitting diode chip capable of reducing light loss due to a metal reflective layer and improving luminous efficacy, and a light emitting device having the same.

Exemplary embodiments of the present disclosure provide a flip chip type light emitting diode chip which has excellent electrical reliability while using a distributed Bragg reflector having high reflectivity, and a light emitting device having the same.

Exemplary embodiments of the present disclosure provide a compact light emitting diode flip chip that is structurally simple, and a light emitting device having the same.

In accordance with one aspect of the present disclosure, there is a light emitting diode chip comprising: a first conductivity type semiconductor layer; a mesa disposed on a partial region of the first conductivity type semiconductor layer and including an active layer and a second conductivity type semiconductor layer; a transparent electrode being in ohmic contact with the second conductivity type semiconductor layer; a first current spreader disposed on the first conductivity type semiconductor layer near the mesa, and being in ohmic contact with the first conductivity type semiconductor layer; a second current spreader disposed on the transparent electrode and electrically connected to the transparent electrode; an insulation layer covering the first conductivity type semiconductor layer, the mesa, the transparent electrode, the first current spreader and the second current spreader, having openings exposing portions of the first current spreader and the second current spreader, and including a distributed Bragg reflector; and a first pad electrode and a second pad electrode disposed on the insulation layer, and connected to the first and second current spreaders through the openings, respectively, wherein each of the first current spreader and the second current spreader has a connection pad and an elongated extension extending from the connection pad, wherein a lateral distance between the first current spreader and the mesa is larger than a thickness of the insulation layer, wherein the first current spreader includes a flat lower surface, a flat upper surface, and a first side surface and a second side surface located on both sides of the flat upper surface, wherein the first side surface is disposed closer to the mesa than the second side surface, wherein each of the first side surface and the second side surface includes a plurality of inclined surface sections, wherein one or more of the inclined surface sections have inclination angles of 55 degrees or less with respect to an upper surface of the first conductivity type semiconductor layer, and wherein the first side surface closer to the mesa is longer than the second side surface.

In accordance with another aspect of the present disclosure, there is a light emitting device comprising: a base, a light emitting diode chip disposed on the base, wherein the light emitting diode chip is flip-bonded so that the first and second pad electrodes face the base.

In accordance with aspects of the present disclosure, it is possible to achieve a higher reflectivity compared with a metal reflective layer, and furthermore, to improve the stability of a reflector since the distributed Bragg reflector is used. In addition, in a structure wherein inclined side surfaces of the first conductivity type semiconductor layer, the mesa, and the current spreader are controlled, it is possible to prevent breakage of the distributed Bragg reflector, thereby providing a light emitting diode chip having high electrical stability.

The foregoing general description and the following detailed description are exemplary and explanatory, and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION

Figure 1:
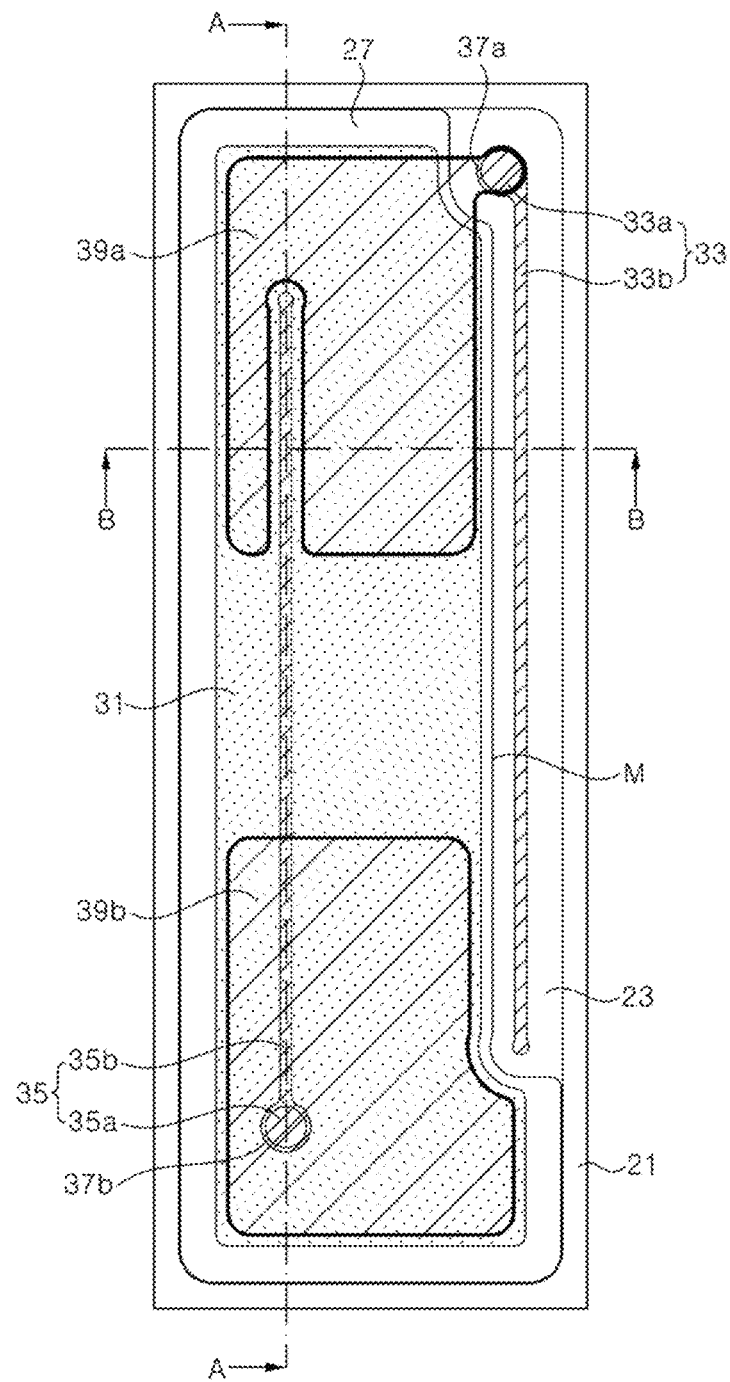
FIG. 1 is a plan view illustrating a light emitting diode chip according to an exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can also be present. Throughout the specification, like reference numerals denote like elements having the same or similar functions.

In accordance with one aspect of the present disclosure, a light emitting diode chip comprises: a first conductivity type semiconductor layer; a mesa disposed on a partial region of the first conductivity type semiconductor layer and including an active layer and a second conductivity type semiconductor layer; a transparent electrode being in ohmic contact with the second conductivity type semiconductor layer; a first current spreader disposed on the first conductivity type semiconductor layer near the mesa, and being in ohmic contact with the first conductivity type semiconductor layer; a second current spreader disposed on the transparent electrode and electrically connected to the transparent electrode; an insulation layer covering the first conductivity type semiconductor layer, the mesa, the transparent electrode, the first current spreader and the second current spreader, having openings exposing portions of the first current spreader and the second current spreader, and including a distributed Bragg reflector; and a first pad electrode and a second pad electrode disposed on the insulation layer, and connected to the first and second current spreaders through openings, respectively, wherein each of the first current spreader and the second current spreader has a connection pad and an elongated extension extending from the connection pad, wherein a lateral distance between the first current spreader and the mesa is larger than a thickness of the insulation layer, wherein the first current spreader includes a flat lower surface, a flat upper surface, and first side surface and the second side surface located on both sides of the flat upper surface, wherein the first side surface is disposed closer to the mesa than the second side surface, wherein each of the first side surface and the second side surface includes a plurality of inclined surface sections, wherein one or more of the inclined surface sections have inclination angles of 55 degrees or less with respect to an upper surface of the first conductivity type semiconductor layer, and wherein the first side surface closer to the mesa is longer than the second side surface.

In accordance with one aspect of the present disclosure a structure wherein the distributed Bragg reflector is used to reflect light, it is possible to reduce light loss due to the metal reflective layer, and furthermore, to provide a highly efficient light emitting diode. Also, it is possible to evenly spread the current in the light emitting diode chip by using the first and second current spreaders.

Meanwhile, the distributed Bragg reflectors are alternately stacked insulation layers having different indices of refraction, and reflectivity is improved as the number of stacked layers increases. However, breakage of the distributed Bragg reflector may occur due to a condition of a surface on which it is formed. In particular, if the number of stacked layers is increased to achieve a high reflectivity, a thickness thereof tends to increase and breakage is likely to occur. In the present embodiment, a lateral distance between the first current spreader and the mesa is larger than a thickness of the insulation layer, and the lengths of both side surfaces of the first current spreader are adjusted. Thus, it is possible that an inclination of first side surface of the first current spreader is mitigated, thereby preventing the occurrence of breakage of the distributed Bragg reflector while improving the reflectivity of the distributed Bragg reflector.

Each of a first side surface and a second side surface of the first current spreader has a width greater than the flat upper surface, and the first side surface of the first current spreader may be more gently inclined than the second side surface as a whole.

In addition, each of the first side surface and the second side surface of the first current spreader may include a first side surface section, a second side surface section, and a third side surface section, which sequentially extend from the lower surface to the upper surface, wherein the second side surface section may be more gently inclined and have a larger width than the first and third side surface sections.

Furthermore, on the first side surface, the first side surface section may be more steeply inclined and have a larger width than the third side surface section. In addition, on the second side surface, the first side surface section may be more gently inclined and have a larger width than the third side surface sections.

The second current spreader may include a flat lower surface, a flat upper surface, and the first side surface and the second side surface disposed on both sides of the flat upper surface, wherein the first side surface and the second side surface may be asymmetric with respect to the flat upper surface.

Meanwhile, the second pad electrode may be spaced apart from the first current spreader in the lateral direction so as not to overlap with the first current spreader. Accordingly, it is possible to prevent an electrical short circuit between the second pad electrode and the first current spreader even if breakage occurs in the insulation layer.

In addition, the first pad electrode may be spaced apart from the second current spreader in the lateral direction so as not to overlap with the second current spreader. Accordingly, it is possible to prevent an electrical short circuit between the first pad electrode and the second current spreader even if breakage occurs in the insulation layer.

In one embodiment, the first pad electrode may partially overlap with the extension of the first current spreader. In another embodiment, the first pad electrode may be spaced apart from the extension of the first current spreader in the lateral direction so as not to overlap with the extension of the first current spreader.

The light emitting diode chip may further include a substrate disposed under the first conductivity type semiconductor layer, wherein a side surface of the first conductivity type semiconductor layer and a side surface of the mesa may have an inclination angle of smaller than 45 degrees with respect to an upper surface of the substrate, respectively. As a result, it is possible to prevent breakage in the insulation layer covering the first conductivity type semiconductor layer and the side surface of the mesa.

In one embodiment, the light emitting diode chip may further include an additional first connection pad being in ohmic contact with the first conductivity type semiconductor layer, wherein the additional connection pad may be spaced apart from the first current spreader. The insulation layer may further include an opening exposing the additional connection pad, wherein the first pad electrode may be connected to the additional connection pad through the opening.

Moreover, the light emitting diode chip may further include an additional second connection pad connected to the transparent electrode, wherein the additional second connection pad may be spaced apart from the second current spreader. The insulation layer may further include an opening exposing the additional second connection pad, wherein the second pad electrode may be connected to the additional second connection pad through the opening.

In one embodiment, the first current spreader may be disposed on an outer surface of the mesa, near the side surface of the mesa.

In another embodiment, the mesa may include a through-groove exposing the first conductivity type semiconductor layer, wherein the first current spreader may be disposed on the first conductivity type semiconductor layer in the through-groove.

Meanwhile, thicknesses of the first current spreader and the second current spreader may be larger than a thickness of the mesa. Furthermore, the insulation layer may be thicker than the first and second current spreaders or the pad electrodes.

Moreover, in some embodiments, the extension of the first current spreader and the extension of the second current spreader may be parallel to each other.

Meanwhile, the light emitting diode chip may further include a substrate disposed under the first conductivity type semiconductor layer, where the first conductivity type semiconductor layer may be disposed within a region surrounded by edges of the substrate, and wherein the insulation layer may cover an upper surface of the substrate exposed around the first conductivity type semiconductor layer.

In accordance with another aspect of the present disclosure, a light emitting device comprises a base, and a light emitting diode chip disposed on the base. In the light emitting diode chip described above, the first and second pad electrodes are flip-bonded so as to face the base.

The base may have an elongated band shape, and the light emitting diode chip may be arranged along a longitudinal direction on the base.

Hereinafter, exemplary embodiments of the present disclosure will be described in detail with reference to the accompanying drawings.

Figure 2:
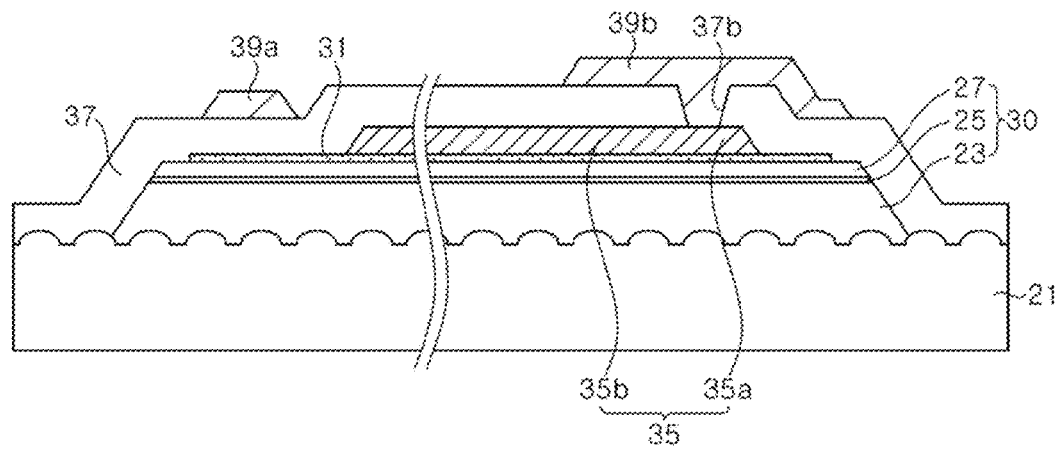
FIG. 2 is a cross-sectional view taken along the line A-A in FIG. 1.
Figure 3:
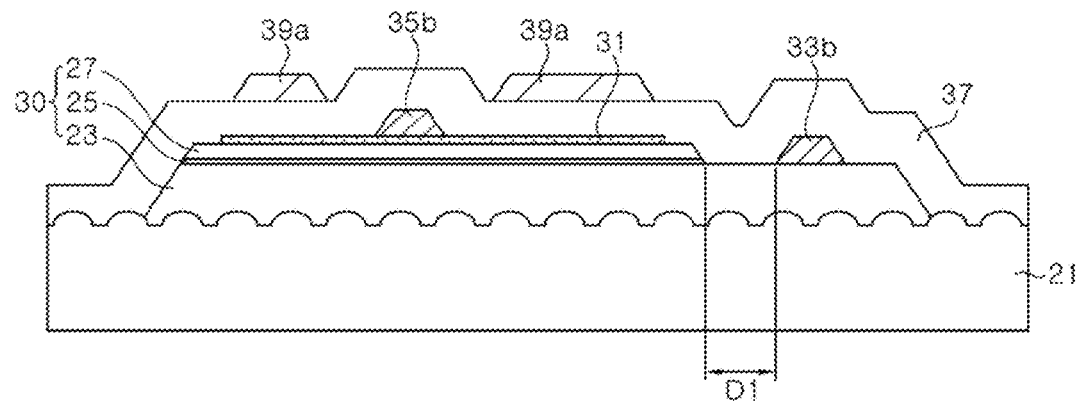
FIG. 3 is a cross-sectional view taken along the line B-B of FIG. 1.

FIG. 1 is a plan view illustrating a light emitting diode chip according to an exemplary embodiment of the present disclosure, FIG. 2 is a cross-sectional view taken along the line A-A in FIG. 1, and FIG. 3 is a cross-sectional view taken along the line B-B of FIG. 1.

Referring to FIGS. 1 through 3, the light emitting diode chip according to the present embodiment includes a substrate 21, a light emitting structure 30, a transparent electrode 31, a first current spreader 33, a second current spreader 35, an insulation layer 37, a first pad electrode 39a and a second pad electrode 39b. The light emitting diode chip may have a long rectangular shape as shown in FIG. 1, and may be a compact light emitting diode chip having a relatively small horizontal cross sectional area. A longitudinal length of the light emitting diode chip may be in the range of two to three times a lateral length thereof. For example, the longitudinal length may be about 480 to 600 µm, and the lateral length may be about 170 to 220 µm. In addition, the light emitting diode chip may have an overall thickness of about 100 µm to 200 µm. The dimensions discussed here are exemplary and the embodiments of the present disclosure are not limited.

The substrate 21 may be an insulating substrate, or alternatively, a conductive substrate. The substrate 21 may be a growth substrate for growth of the light emitting structure 30, and may include a sapphire substrate, a silicon carbide (SiC) substrate, a silicon (Si) substrate, a gallium nitride (GaN) substrate, an aluminum nitride (AlN) substrate, or other substrates. As shown in FIGS. 2 and 3, the substrate 21 may include a plurality of protrusions disposed on at least a partial region of an upper surface thereof. On the substrate 21, the plurality of protrusions may be disposed in a regular, or irregular pattern. For example, the substrate 21 may include a patterned sapphire substrate (PSS) having a plurality of protrusions disposed on an upper surface thereof. The substrate 21 may have a thickness within a range of about 100 to 200 µm by way of example.

The light emitting structure 30 is disposed on the substrate 21. In addition, a lower surface of the light emitting structure 30 may have a smaller area than an upper surface of the substrate 21, and the upper surface of the substrate 21 may be exposed around the light emitting structure 30. Some of the plurality of protrusions are interposed between the light emitting structure 30 and the substrate 21, and the plurality of protrusions that are not covered with the light emitting structure 30 are exposed around the light emitting structure 30, as illustrated in FIGS. 2 and 3.

In a structure where the upper surface of the substrate 21 is exposed to an isolation region around the light emitting structure 30, it is possible to reduce bowing in the fabrication process of the light emitting diode chip. Accordingly, damage to the light emitting structure 30 due to bowing may be prevented, thereby improving production yield. In addition, the light emitting diode chip may reduce stress applied to the light emitting structure 30 by suppressing bowing, thereby allowing the substrate 21 to be fabricated in a slimmer thickness. As a result, the light emitting diode chip may have a slim structure having a thickness of about 100 µm. This structure will be described in more detail in the following exemplary embodiments.

The light emitting structure 30 includes a first conductivity type semiconductor layer 23, a second conductivity type semiconductor layer 27 disposed on the first conductivity type semiconductor layer 23, and an active layer 25 interposed between the first conductivity type semiconductor layer 23 and the second conductivity type semiconductor layer 27. The light emitting structure 30 may have an overall thickness of about 5 to 10 μm by way of example. Other dimensions are possible.

The first conductivity type semiconductor layer 23, the active layer 25 and the second conductivity type semiconductor layer 27 may include a III-V nitride-based semiconductor, for example, a nitride-based semiconductor such as (Al, Ga, In)N. The first conductivity type semiconductor layer 23 may include an n-type impurity (for example, Si, Ge, Sn) and the second conductivity type semiconductor layer 27 may include a p-type impurity (for example, Mg, Sr, Ba), or vice versa. The active layer 25 may include a multi-quantum well (MQW) structure and the composition ratio of the nitride-based semiconductors may be adjusted to emit light having a desired wavelength. Particularly, in this exemplary embodiment, the second conductivity type semiconductor layer 27 may be a p-type semiconductor layer.

The first conductivity type semiconductor layer 23 may have an inclined side surface. Furthermore, an inclination angle of the inclined side surface may be about 45 degrees or less with respect to a bottom surface of the substrate 21. In a structure where the side surface of the first conductivity type semiconductor layer 23 has a gentle inclination, the light emitting diode chip may prevent an insulation layer 37 covering the light emitting structure 30 and the substrate 21 from suffering defects such as cracks.

The light emitting structure 30 includes a mesa M. (FIG. 1). The mesa M may be disposed in a partial region of the first conductivity type semiconductor layer 23 and includes the active layer 25 and the second conductivity type semiconductor layer 27. The mesa M may have a thickness of about 1 to 2 μm by way of example. In this structure, the first conductivity type semiconductor layer 23 may be partially exposed around the mesa M. In some regions, an inclined surface of the mesa M is flush with the inclined surface of the first conductivity type semiconductor layer 23, and thus an exposed surface of the upper surface of the first conductivity type semiconductor layer 23 may be limited to one side of the mesa M. However, the present embodiment is not limited thereto, but the upper surface of the first conductivity type semiconductor layer 23 may be exposed around the mesa M. In another embodiment, a through hole or a through-groove may be formed in the mesa M to expose the first conductivity type semiconductor layer 23.

The mesa M may have a rectangular shape in which a portion of the mesa M is removed to expose the first conductivity type semiconductor layer 23. In addition, the mesa M may have an inclined side surface, and an inclination angle of the inclined side surface may be about 45 degrees or less with respect to the bottom surface of the substrate 21. Furthermore, in a case that the side surface the first conductivity type semiconductor layer 23 is in flush with that of the mesa M, the first conductivity type semiconductor layer 23 and the mesa M may form the same inclined surface.

The transparent electrode 31 is disposed on the second conductivity type semiconductor layer 27. The transparent electrode 31 may be in ohmic contact with the second conductivity type semiconductor layer 27. The transparent electrode may include, for example, an optically transparent conductive oxide layer such as indium tin oxide (ITO), zinc oxide (ZnO), zinc indium tin oxide (ZITO), zinc indium oxide (ZIO), zinc tin oxide (ZTO), gallium indium tin oxide (GITO), gallium indium oxide (GIO), gallium zinc oxide (GZO), aluminum doped zinc oxide (AZO), and fluorine tin oxide (FTO). The conductive oxides may further include various dopants.

The transparent electrode 31 including an optically transparent conductive oxide has an excellent ohmic characteristic with the second conductivity type semiconductor layer 27. That is, since contact resistance between a conductive oxide such as ITO or ZnO and the second conductivity type semiconductor layer 27 is lower than that between a metallic electrode and the second conductivity type semiconductor layer 27, it is possible to reduce forward voltage $V_f$ of the light emitting diode chip by applying the transparent electrode 31 including the conductive oxide, thereby improving luminous efficacy.

Particularly, in a case of a compact light emitting diode chip for use in the present embodiment, the light emitting diode chip is greatly influenced by the ohmic characteristic because of a relatively low current density thereof. Accordingly, in a structure where the transparent electrode 31 is used, and thus the ohmic characteristic is improved, it is possible to more effectively improve the luminous efficacy. In addition, the conductive oxide has a lower probability of peeling off of the nitride-based semiconductor layer than the metallic electrode, and is stable even after long use. Therefore, it is possible to improve reliability of the light emitting diode chip by using the transparent electrode 31 including the conductive oxide.

The transparent electrode 31 may have a thickness of about 400 Å to 3,000 Å, without being limited thereto. If the thickness of the transparent electrode 31 is excessively large, light passing through the transparent electrode 31 may be absorbed, and thus a loss may occur. Therefore, the thickness of the transparent electrode 31 is configured to be 3000 Å or less.

The transparent electrode 31 may be disposed to substantially cover an entire upper surface of the second conductivity type semiconductor layer 27, thereby improving current spreading efficiency upon operation of the light emitting diode chip. For example, the side surfaces of the transparent electrode 31 may be disposed along the side surfaces of the mesa M. In addition, the transparent electrode 31 may include an opening to partially expose the second conductivity type semiconductor layer 27. The opening can be formed to be at least partially filled with a second pad electrode 39b described below, the second pad electrode 39b may have an increased contact area. Accordingly, it is possible to effectively prevent the second pad electrode 39b from being separated from the transparent electrode 31 or the light emitting structure 30.

The first current spreader 33 is disposed on the first conductivity type semiconductor layer 23, near the mesa M. The first current spreader 33 is in ohmic contact with the first conductivity type semiconductor layer 23 and spreads the current. The first current spreader 33 includes a connection pad 33a and an extension 33b extending from the connection pad 33a. The connection pad 33a has a greater width than the width of the extension 33b, and the extension 33b extends in an elongated shape along the lighting emitting diode chip in the longitudinal direction. The extension 33b is arranged in the elongated shape along the lighting emitting diode chip in the longitudinal direction, so the current may be evenly spread over a wide region in the light emitting diode chip having the elongated shape.

The extension 33b may be spaced apart from the mesa M in the lateral direction so as not to overlap with the mesa M, and may extend along edges of the mesa M, as shown in FIG. 1.

Meanwhile, the first current spreader 33 is spaced apart from the mesa M at a sufficient distance, and a distance D1 between the first current spreader 33 and the mesa M is larger than a thickness of the insulation layer 37, as shown in FIG. 3. However, the light emitting area is reduced if the distance D1 of the first current spreader 33 is excessively large, and for that reason, the distance D1 may be limited not to exceed three times of a width of the extension 33b.

The second current spreader 35 is disposed on the transparent electrode 31 and is electrically connected to the transparent electrode 31 to help spread the current in the second conductivity type semiconductor layer 27. The conductive oxide may have a relatively low current spreading capability in the lateral direction as compared with the metallic electrode, but the current spreading capability may be enhanced by using the second current spreader 35. Furthermore, a thickness of the transparent electrode 31 may be reduced by applying the second current spreader 35.

The second current spreader 35 may include a connection pad 35a and an extension 35b extending from the connection pad 35a. The connection pad 35a has a greater width than the extension 35b, and the extension 35b extends in an elongated shape along the light emitting diode chip in the longitudinal direction. The extension 35b is arranged in the elongated shape along the lighting emitting diode chip in the longitudinal direction, and the current may be evenly spread over a wide region in the light emitting diode chip having the elongated shape. The extension 35b may be disposed in parallel with the extension 33b of the first current spreader 33, and thus the interval therebetween may be kept constant.

In some embodiments, the first and second current spreaders 33 and 35 may be formed substantially at the same time using the same material in the same process, and thus may have the same layer structure with each other. In other embodiments, a different process, a different timing, different materials, or a combination thereof may be used. For example, the first and second current spreaders 33 and 35 may include an Al reflective layer and may include an Au connection layer. Specifically, the first and second current spreaders 33 and 35 may have a layered structure of Cr/Al/Ti/Ni/Ti/Ni/Au/Ti. Thicknesses of the first and second current spreaders 33 and 35 may be greater than a thickness of the mesa M, and thus an upper surface of the first current spreader 33 is positioned higher than an upper surface of the mesa M. For example, the thickness of the mesa M may be approximately 1.5 μm, and the thicknesses of the first and second current spreaders 33 and 35 may be approximately 2 μm.

Sectional shapes of the extensions 33b and 35b of the first and second current spreaders 33 and 35 will be described in detail below with reference to FIGS. 4 and 5.

The insulation layer 37 covers the first conductivity type semiconductor layer 23, the mesa M, the transparent electrode 31, and the first and second current spreaders 33 and 35. The insulation layer 37 covers an upper region and the side surfaces of the mesa M, and also covers the first conductivity type semiconductor layer 23 exposed around the mesa M and side surfaces of the first conductivity type semiconductor layer 23. The insulation layer 37 may further cover the upper surface of the substrate 21 exposed around the first conductivity type semiconductor layer 23. The insulation layer 37 also covers a region between the first current spreader 33 and the mesa M.

Meanwhile, the insulation layer 37 has openings 37a and 37b exposing the connection pads 33a and 35a, as shown in FIG. 1.

The insulation layer 37 includes a distributed Bragg reflector. The distributed Bragg reflector may be formed by repeatedly stacking dielectric layers having different indices of refraction and including, for example, $TiO_2$, $SiO_2$, $HfO_2$, $ZrO_2$, $Nb_2O_5$, $MgF_2$, or others. For example, the insulation layer 37 may have an alternating structure of $TiO_2/SiO_2$ layers. The distributed Bragg reflector is fabricated to reflect light generated in the active layer 25 and is formed of a plurality of pairs of layers to improve the reflectivity. In this embodiment, the distributed Bragg reflector may be composed of 10 to 25 pairs of layers. The insulation layer 37 may include additional insulation layers with the distributed Bragg reflector, for example, an interface layer positioned below the distributed Bragg reflector and a protective layer covering the distributed Bragg reflector to improve the adhesion of the distributed Bragg reflector and a lower layer thereof. The interface layer may be formed of, for example, a $SiO_2$ layer, and the protective layer may be formed of $SiN_x$. The layer of $SiN_x$ has favorable moisture resistance to protect the light emitting diode chip from moisture.

The insulation layer 37 may have a thickness of about 2 μm to 5 μm. The distributed Bragg reflector may have a reflectivity of 90% or higher with respect to light generated in the active layer 25, and the distributed Bragg reflector having a reflectivity near 100% may be provided by controlling the kinds, thickness and stacking cycle of the dielectric layers constituting the distributed Bragg reflector. Furthermore, the distributed Bragg reflector may also have a high reflectivity with respect to visible light other than the light generated in the active layer 25.

However, in a case that the thickness of the distributed Bragg reflector increases, breakage may occur in the insulation layer 37 depending on the state of the surface on which the distributed Bragg reflector is formed. In particular, an inclination of a side surface of the first conductivity type semiconductor layer 23 or an inclination of a side surface of the mesa M has effect on the occurrence of breakage of the insulation layer 37. Furthermore, the breakage of the insulation layer 37 may easily occur between the first current spreader 33 and the mesa M. To prevent this, in this embodiment, the first current spreader 33 is sufficiently spaced apart from the mesa M, and the inclination of the side surface of the first current spreader 33 is controlled. Shapes of the first current spreader 33 and the second current spreader 35 will be described below in detail with reference to FIGS. 4 and 5. Inclination angles of the side surfaces of the first conductivity type semiconductor layer 23 and the mesa M are limited to 45 degrees or below, and thus it is possible to prevent the breakage of the insulation layer 37 near the first conductivity type semiconductor layer 23 and the mesa M.

The first pad electrode 39a and the second pad electrode 39b are disposed on the insulation layer 37, and are electrically connected to the connection pads 33a and 35a through the openings 37a and 37b, respectively.

As shown in FIG. 1, the first pad electrode 39a is generally disposed in an upper region of the transparent electrode 31, and a portion of the first pad electrode 39a extends to the connection pad 33a. However, the first pad electrode 39a may be spaced apart from the extension 33b in the lateral direction so as not to overlap with the extension 33b.

In addition, the first pad electrode 39a is spaced apart from the second current spreader 35 in the lateral direction so as not to overlap with the second current spreader 35. As shown in FIG. 1, the first pad electrode 39a may have a recess for receiving the extension 35b so as not to overlap with the extension 35b. The first pad electrode 39a does not overlap with the second current spreader 35, and it is possible to prevent an electrical short circuit between the first pad electrode 39a and the second current spreader 35 even if a crack occurs in the insulation layer 37.

The second pad electrode 39b is disposed in the upper region of the transparent electrode 31 and is connected to the connection pad 35a of the second current spreader 35 through the opening 37b. As shown in the drawing, the second pad electrode 39b may overlap with the connection pad 35a of the second current spreader 35, and may further overlap with the extension 35b. However, in another embodiment, the second pad electrode 39b may be spaced apart from the extension 35b in the lateral direction so as not to overlap with the extension 35b of the second current spreader 35. Meanwhile, the second pad electrode 39b is spaced apart from the first current spreader 33 in the lateral direction so as not to overlap with the first current spreader 33. In particular, the second pad electrode 39b is disposed within an upper region of the mesa M, and does not extend toward a region between the mesa M and the first current spreader 33.

The first pad electrode 39a and the second pad electrode 39b are arranged in the longitudinal direction on the mesa M, and are spaced apart from each other in a predetermined distance. A shortest distance between the first pad electrode 39a and the second pad electrode 39b may be, for example, about 3 μm to about 100 μm.

The first pad electrode 39a and the second pad electrode 39b may be formed at the same time using the same material using the same process, and thus may have the same layer structure as the other. Thicknesses of the first and second pad electrodes 39a and 39b may be smaller than the thickness of the insulation layer 37, and may be, for example, about 2 μm.

Figure 4:
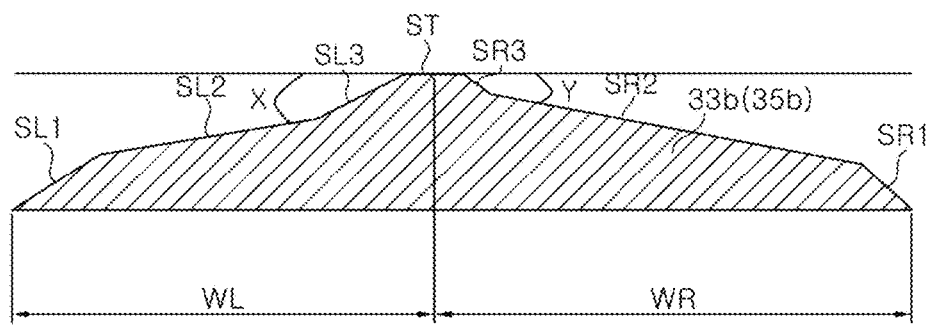
FIG. 4 is a schematic enlarged cross-sectional view illustrating a current spreader of the light emitting diode chip of FIG. 1.
Figure 5:
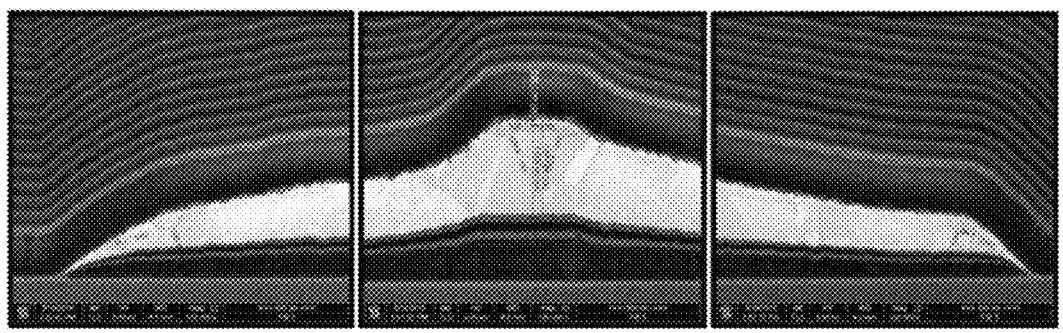
FIG. 5 is a SEM photograph showing a cross section of the current spreader.

FIG. 4 is a schematic enlarged cross-sectional view illustrating a current spreader of the light emitting diode chip of FIG. 1, and FIG. 5 is a SEM photograph showing a cross section of the current spreader.

Referring to FIG. 4, the extensions 33b and 35b of the first and second current spreaders 33 and 35 may have a generally similar cross-sectional shape. Each of the extensions 33b and 35b may have a flat lower surface and a flat upper surface ST opposite to the lower surface. Each of the extensions 33b and 35b includes both side surfaces connecting the lower surface and the upper surface. Each of the side surfaces may have first side surface sections SL1 and SR1, second side surface sections SL2 and SR2, and third side surface sections SL3 and SR3.

As shown in FIG. 4, both side surfaces of the extensions 33b and 35b are asymmetric to each other, and WL and WR, which are lengths from the flat upper surface ST to opposite ends, are different from each other. In FIG. 4, WR is larger than WL, and accordingly, inclinations of the side surface sections SR1 and SR2, and SR3 as shown on the right side are more gently inclined as a whole when compared with those of the side surface sections SL1, SL2, and SL3 as shown on the left side. As one example, an angle X between the upper surface and at a first point on the side surface sections SL1, SL2, SL3 may be larger than an angle Y between the upper surface and at a second point on the surface sections SR1, SR2, SR3. In this example, the second point has the same position as the first point. The embodiment is not limited to this and different inclination angles relative to the upper surface may be configured with respect to the side surface sections SL1, SL2, SL3, and the side surface sections SR1, SR2, SR3.

In particular, in the first current spreader 33, first side surface (right side) having a gentle inclination is disposed near the mesa M, and thus the insulation layer 37 may be stably formed between the mesa M and the first current spreader 33 without breakage.

Meanwhile, the first side surface section SR1 may be more steeply inclined than the first side surface section SL1, where an inclination angle of the first side surface section SR1 may be smaller than 55 degrees. Accordingly, an inclination angle of the first side surface section SL1 is smaller than 55 degrees. However, a width of the first side SR1 is formed to be relatively narrow, and thus a crack does not occur in the insulation layer 37 due to the inclination of the first side surface section SR1.

The third side surface section SR3 may be inclined generally similar to the third side surface section SL3, but may have a narrower width than the third side surface section SL3. Inclination angles of the third side surface sections SR3 and SL3 may be smaller than 55 degrees. Meanwhile, an inclination angle of the second side surface section SR2 is smaller than the inclination angles of the first and third side surface sections SR1 and SR3, and an inclination angle of the second side surface section SL2 is also smaller than the inclination angles of the first and third side surface sections SL1 and SL3. The inclination angles of the second side surface sections SR2 and SL2 is smaller than 55 degrees. Further, the second side surface section SR2 has a relatively greater width than the second side surface section SL2.

Although the respective side surfaces are shown in straight lines in FIG. 4, the side surfaces may also be formed as curved surfaces in other embodiments.

FIG. 5 is an SEM image of a current spreader in an actually fabricated light emitting diode chip. The SEM image shows the extension 33b disposed on the first conductivity type semiconductor layer 23 and the insulation layer 37 covering the extension 33b. The current spreader is formed to have a layered structure of Cr/Al/Ti/Ni/Ti/Ni/Au/Ti, and the bright portion represents the Au layer. The mesa M is disposed on the right side of the current spreader in FIG. 5.

As shown in FIG. 5, the inclination of side surfaces of the extension 33b is formed to have a gentle curve. FIG. 5 further shows that the insulation layer 37 covering the current spreader is formed without breakage.

Figure 6:
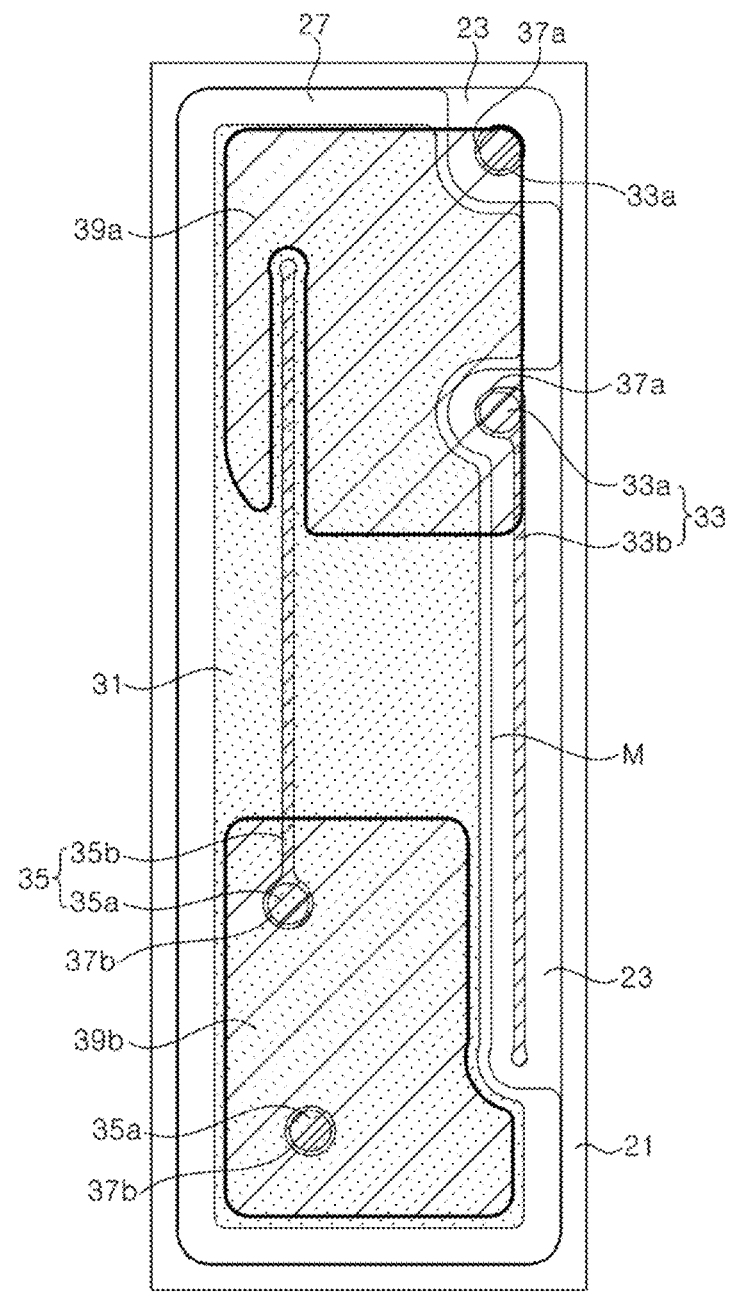
FIG. 6 is a schematic plan view illustrating a light emitting diode chip according to another exemplary embodiment of the present disclosure.

FIG. 6 is a schematic plan view illustrating a light emitting diode chip according to another exemplary embodiment of the present disclosure.

Referring to FIG. 6, the light emitting diode chip according to the present embodiment is substantially similar to the light emitting diode chip described with reference to FIGS. 1 through 3 except that the first and second current spreaders 33 and 35 are formed to be relatively short, and additional connection pads 33a and 35a are further formed.

The extensions 33b and 35b of the first and second current spreaders 33 and 35 have relatively narrow widths and are formed in a longitudinal direction. As a result, it is difficult for current to easily flow from the connection pads 33a and 35a to the ends of the extensions 33b and 35b. Accordingly, in this embodiment, the first and second current spreaders 33 and 35 are formed relatively short, and the additional connection pads 33a and 35a are formed, thereby further improving the current spreading capability.

The additional connection pad 33a is spaced apart from the first current spreader 33 and disposed near one end of the light emitting diode chip, and the additional connection pad 35a is spaced apart from the second current spreader 35 and disposed near the other end of the light emitting diode chip.

Meanwhile, the insulation layer 37 has openings exposing the additional connection pads 33a and 35a, and the first pad electrode 39a and the second pad electrode 39b are also connected to the additional connection pads 33a and 35a through the openings of the insulation layer 37, respectively.

In this embodiment, the first pad electrode 39a is illustrated as in part overlapping with the extension 33b. However, as described above, the first pad electrode 39a may be spaced apart from the extension 33b in the lateral direction so as not to overlap with the extension 33b.

Figure 7:
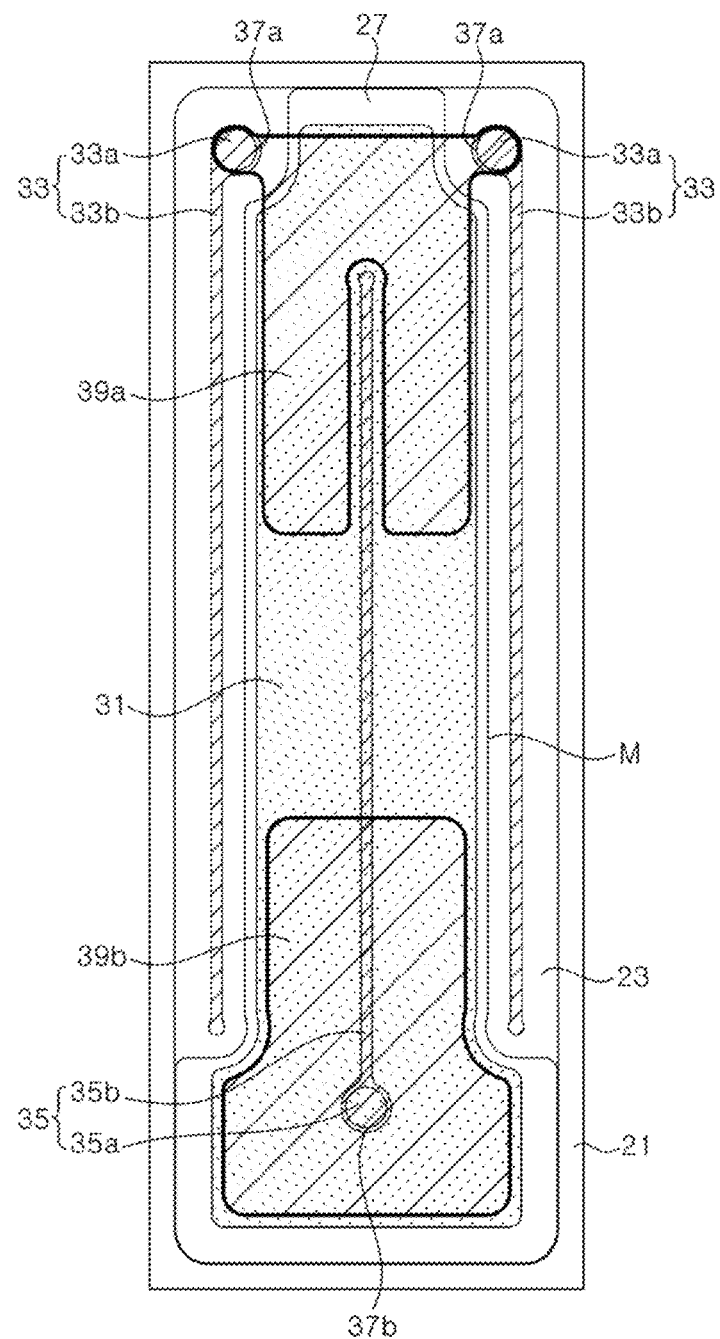
FIG. 7 is a schematic plan view illustrating a light emitting diode chip according to another exemplary embodiment of the present disclosure.

FIG. 7 is a schematic plan view illustrating a light emitting diode chip according to another exemplary embodiment of the present disclosure.

Referring to FIG. 7, the light emitting diode chip according to this embodiment is substantially similar to the light emitting diode chip described with reference to FIG. 1 except that two first current spreaders 33 are disposed along both side edges of the light emitting diode chip.

The first current spreaders 33 may be disposed along both side edges of the light emitting diode chip, and thus the second current spreader 35 may be disposed to pass through a center of the light emitting diode chip.

Figure 8:
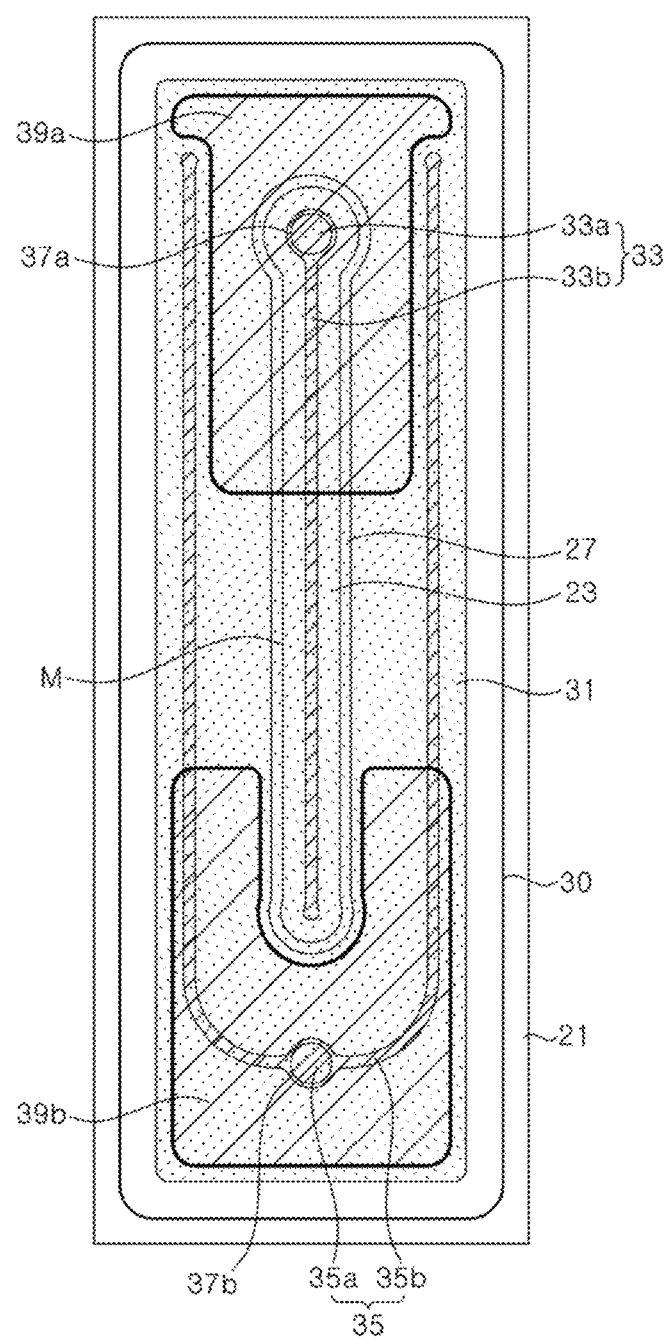
FIG. 8 is a schematic plan view illustrating a light emitting diode chip according to another exemplary embodiment of the present disclosure.

FIG. 8 is a schematic plan view illustrating a light emitting diode chip according to another exemplary embodiment of the present disclosure.

Referring to FIG. 8, the light emitting diode chip according to the present embodiment is substantially similar to the light emitting diode chip described with reference to FIG. 1 except that the mesa M includes a through-groove which the first conductivity type semiconductor layer 23 is exposed in a central region, and current spreader 33 is disposed on the first conductivity type semiconductor layer 23 in the through-groove of the mesa M.

The second current spreader 35 may have two extensions 35b extending to both sides from the connection pad 35a, where these extensions 35b extend along both sides of the first current spreader 33.

The light emitting diode chip according to this embodiment is a flip chip type light emitting diode and may be used in various light emitting devices. In particular, light emitting diode chips having a long shape are suitable for LED lamps using LED filaments.

Figure 9:
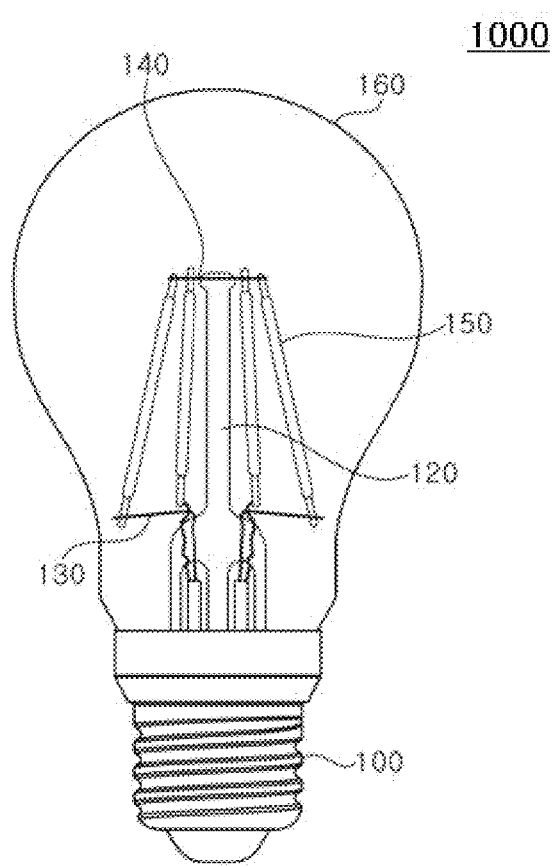
FIG. 9 is a schematic front view illustrating an LED lamp according to an exemplary embodiment of the present disclosure.

FIG. 9 is a schematic front view illustrating an LED lamp 1000 according to an exemplary embodiment of the present disclosure. Referring to FIG. 9, the LED lamp 1000 includes a bulb base 100, a central column 120, a lower lead wire 130, an upper lead wire 140, an LED filament 150, and a light transmitting bulb 160.

The bulb base 100 has the same electrode structure as a typical light bulb. In addition, the bulb base 100 may receive passive or active elements such as an AC/DC converter and the like therein.

Since the bulb base 100 has the same electrode structure as that of the typical light bulb, the LED lamp according to the exemplary embodiments may employ a typical socket and thus can reduce installation costs for supplementary facilities in use of the LED lamp.

The central column 120 is secured to the bulb base 100 and is placed at the center of the LED lamp. The central column 120 may include a support section, a column section, and an upper end. The central column 120 serves to support the LED filament 150 and may be formed of, for example, glass.

The lower lead wire 130 electrically connects the bulb base 100 and the LED filament 150. The lower lead wire 130 is bonded to one end of a lower portion of the LED filament 150. One lower lead wire 130 is connected to each LED filament 150 and these lower lead wires 130 are divided into two groups and connected to two electrodes of the bulb base 100, respectively.

Meanwhile, the upper lead wire 140 is bonded to one end of an upper portion of the LED filaments 150. One upper lead wire 140 may connect a pair of LED filaments 150 to each other. In this embodiment, two pairs of LED filaments 150 are shown, and two upper lead wires 140 connect two pairs of LED filaments 150 to each other in series. However, the present disclosure is not limited thereto, but one pair or three or more pairs of LED filaments 150 connected to each other through the upper lead wire 140 may be disposed.

The light transmitting bulb 160 surrounds the LED filament 150 so as to separate the LED filament 150 from an external environment. The light transmitting bulb 160 may be formed of glass, plastic or other materials. The light transmitting bulb 160 may have a variety of shapes and sizes and also may have the same shape as a typical light bulb.

The LED filament 150 is electrically connected to the bulb base 100 through the lower lead wire 130 and the upper lead wire 140. The LED filament 150 may include a plurality of light emitting diode chips flip-bonded on a base, and may include a wavelength conversion layer covering the light emitting diode chips. The base is an elongated band-shaped substrate, and may be, for example, a translucent substrate such as a quartz substrate. However, in other embodiments, the base may be a flexible substrate such as a strap.

Figure 10:
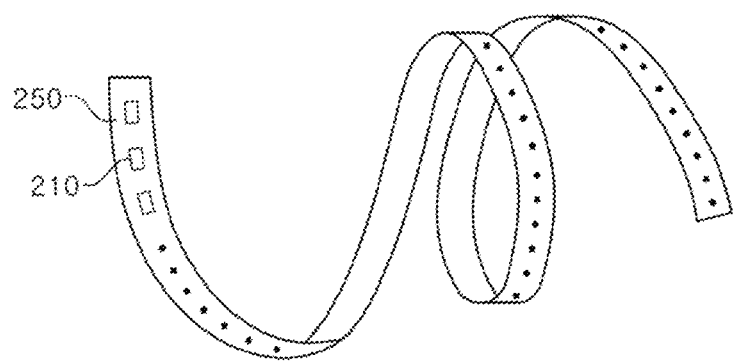
FIG. 10 is a schematic view illustrating a light strap according to an exemplary embodiment of the present disclosure.

FIG. 10 is a schematic view illustrating a light strap according to an exemplary embodiment of the present disclosure.

Referring to FIG. 10, the light strap according to this exemplary embodiment includes a base 250, conductive interconnections (not shown), and an array of light emitting diode chips 210. Herein, the base 250 has an elongated shape and may be a flexible transparent film.

Since the base 250 is a flexible film and includes the array of small light emitting diode chips 210 thereon, the light strap may be easily deformed or change its shape into a desired shape. Thus, advantageously, such a light strap may be easily installed in a narrow space, and is suitable for ornamental or portable purposes, may be used as internal or external ornamentation lamps for vehicles or as various logo displays, and may also be attached to clothes. Further, the light strap may be used as an LED filament and applied to an LED lamp.

In this embodiment, the light emitting diode chip 210 is the light emitting diode chips as described above, and a longitudinal direction thereof is arranged along the longitudinal direction of the strap. Further, although not shown, the wavelength conversion layer may cover the light emitting diode chips 210. Alternatively, the wavelength conversion layer may be formed in advance on the light emitting diode chips 210 and mounted on the base 250.

Figure 11:
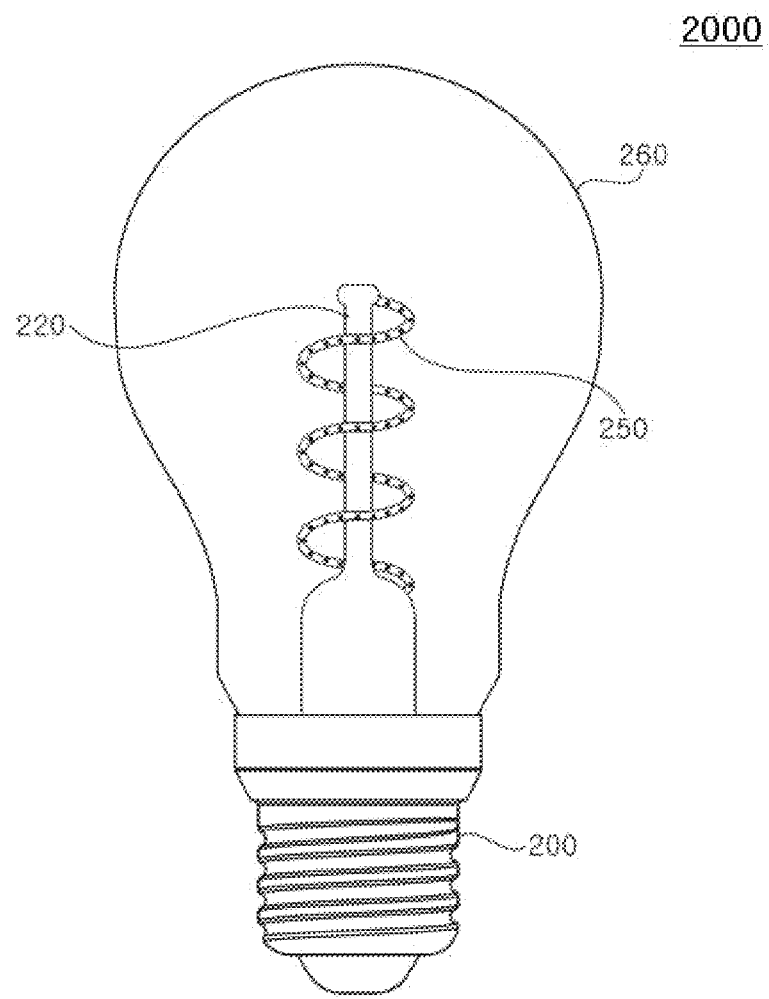
FIG. 11 is a schematic front view illustrating an LED lamp according to another exemplary embodiment of the present disclosure.

FIG. 11 is a schematic front view illustrating an LED lamp 2000 according to another exemplary embodiment of the present disclosure.

Referring to FIG. 11, the LED lamp 2000 includes a bulb base 200, a central column 220, an LED filament 250, and a light transmitting bulb 260.

Since the bulb base 200 is the same as the bulb base 100 described in the embodiment of FIG. 9, detailed description thereof will be omitted to avoid redundancy.

The central column 220 is secured to the bulb base 200 and is placed at the center of the LED lamp. The central column 220 may include a support section, a column section, and an upper end. The central column 220 serves to support the LED filament 250 and may be formed of, for example, glass.

The LED filament 250 is a light strap as described with reference to FIG. 10, and includes a base, a conductive interconnection, and a light emitting diode chip, and a description thereof will be omitted. Since the LED filament 250 is formed of a flexible light strap, shapes of the LED filament 250 may be variously modified.

The LED filament 250 may be electrically connected to an electrode of the bulb base 200 through lead wires (not shown).

The light transmitting bulb 260 surrounds the LED filament 250 so as to separate the LED filament 250 from an external environment. The light transmitting bulb 260 may be formed of glass or plastic materials. The light transmitting bulb 260 may have a variety of shapes and may have the same shape as a typical light bulb.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

The invention claimed is:

1. A light emitting diode chip comprising:
a first conductivity type semiconductor layer;
a mesa disposed on a partial region of the first conductivity type semiconductor layer, and including an active layer and a second conductivity type semiconductor layer;
a transparent electrode being in ohmic contact with the second conductivity type semiconductor layer;
a first current spreader disposed on the first conductivity type semiconductor layer near the mesa, and being in ohmic contact with the first conductivity type semiconductor layer;
a second current spreader disposed on the transparent electrode and electrically connected to the transparent electrode;
an insulation layer covering the first conductivity type semiconductor layer, the mesa, the transparent electrode, the first current spreader and the second current spreader, having openings exposing portions of the first current spreader and the second current spreader, and including a distributed Bragg reflector; and
a first pad electrode and a second pad electrode disposed on the insulation layer, and connected to the first and second current spreaders through the openings, respectively;
wherein each of the first current spreader and the second current spreader has a connection pad and an elongated extension extending from the connection pad;
wherein a lateral distance between the first current spreader and the mesa is larger than a thickness of the insulation layer;
wherein the first current spreader includes a flat lower surface, a flat upper surface, and a first side surface and a second side surface located on both sides of the flat upper surface;
wherein the first side surface is disposed closer to the mesa than the second side surface;
wherein each of the first side surface and the second side surface includes a plurality of inclined surface sections, wherein one or more of the inclined surface sections have inclination angles of 55 degrees or less with respect to an upper surface of the first conductivity type semiconductor layer; and
wherein the first side surface closer to the mesa is longer than the second side surface.

2. The light emitting diode chip of claim 1,
wherein each of the first side surface and the second side surface of the first current spreader has a width greater than the flat upper surface; and
the first side surface of the first current spreader is more gently inclined than the second side surface as a whole.

3. The light emitting diode chip of claim 2,
wherein each of the first side surface and the second side surface of the first current spreader includes a first side surface section, a second side surface section, and a third side surface section, which sequentially extend from the lower surface to the upper surface, and the second side surface section has a first inclination angle smaller than a second inclination angle of the first and third side surface sections and has a larger width than widths of the first and third side surface sections.

4. The light emitting diode chip of claim 3,
wherein the first side surface section is more steeply inclined and has a larger width than the third side surface section on the first side surface.

5. The light emitting diode chip of claim 4,
wherein the first side surface section is more gently inclined and has a larger width than the third side surface section on the second side surface.

6. The light emitting diode chip of claim 1,
wherein the second current spreader includes a flat lower surface, a flat upper surface, and first side surface and the second side surface disposed on both sides of the flat upper surface, and the first side surface and the second side surface are asymmetric with respect to the flat upper surface.

7. The light emitting diode chip of claim 1,
wherein the second pad electrode is spaced apart from the first current spreader in the lateral direction so as not to overlap with the first current spreader.

8. The light emitting diode chip of claim 7,
wherein the first pad electrode is spaced apart from the second current spreader in the lateral direction so as not to overlap with the second current spreader.

9. The light emitting diode chip of claim 8,
wherein the first pad electrode partially overlaps with the extension of the first current spreader.

10. The light emitting diode chip of claim 8,
wherein the first pad electrode is spaced apart from the extension of the first current spreader in the lateral direction so as not to overlap with the extension of the first current spreader.

11. The light emitting diode chip of claim 1, further comprising:
a substrate disposed under the first conductivity type semiconductor layer; and
wherein a side surface of the first conductivity type semiconductor layer and a side surface of the mesa have an inclination angle of smaller than 45 degrees with respect to an upper surface of the substrate, respectively.

12. The light emitting diode chip of claim 1, further comprising:
  an additional first connection pad being in ohmic contact with the first conductivity type semiconductor layer, wherein the additional connection pad is spaced apart from the first current spreader;
  wherein the insulation layer further includes an opening exposing the additional connection pad; and
  wherein the first pad electrode is connected to the additional connection pad through the opening.

13. The light emitting diode chip of claim 1, further comprising:
  an additional second connection pad connected to the transparent electrode, wherein the additional second connection pad is spaced apart from the second current spreader;
  wherein the insulation layer further includes an opening exposing the additional second connection pad; and
  wherein the second pad electrode is connected to the additional second connection pad through the opening.

14. The light emitting diode chip of claim 1,
  wherein the mesa includes a through-groove exposing the first conductivity type semiconductor layer; and
  wherein the first current spreader is disposed on the first conductivity type semiconductor layer in the through-groove.

15. The light emitting diode chip of claim 1,
  wherein thicknesses of the first current spreader and the second current spreader are larger than a thickness of the mesa.

16. The light emitting diode chip of claim 15,
  wherein the insulation layer is thicker than the first and second current spreaders or the pad electrodes.

17. The light emitting diode chip of claim 15,
  wherein the extension of the first current spreader and the extension of the second current spreader are parallel to each other.

18. The light emitting diode chip of claim 1, further comprising:
  a substrate disposed under the first conductivity type semiconductor layer;
  wherein the first conductivity type semiconductor layer is disposed within a region surrounded by edges of the substrate, and
  wherein the insulation layer covers an upper surface of the substrate exposed around the first conductivity type semiconductor layer.

19. A light emitting device comprising:
  a base;
  the light emitting diode chip of claim 1; and
  wherein the first and second pad electrodes thereof are flip-bonded so as to face the base.

20. The light emitting device of claim 19,
  wherein the base has an elongated band shape.

* * * * *